United States Patent [19]

Poliniak

[11] 4,097,618
[45] Jun. 27, 1978

[54] METHOD OF TRANSFERRING A SURFACE RELIEF PATTERN FROM A POLY(1-METHYL-1-CYCLOPROPENE SULFONE) LAYER TO A NON-METALLIC INORGANIC LAYER

[75] Inventor: Eugene Samuel Poliniak, Willingboro, N.J.

[73] Assignee: RCA Corporation, New York, N.Y.

[21] Appl. No.: 775,862

[22] Filed: Mar. 9, 1977

[51] Int. Cl.$^2$ ............................................. B05D 3/06
[52] U.S. Cl. ................................... 427/41; 156/643; 156/646; 427/43
[58] Field of Search ...................... 427/43, 38, 39, 41; 156/643, 646

[56] References Cited
U.S. PATENT DOCUMENTS

| 3,615,957 | 10/1971 | Irving et al. ........................ 156/643 |
| 3,884,696 | 5/1975 | Bowden et al. ........................ 427/43 |
| 3,893,127 | 7/1975 | Kaplan et al. ........................ 427/43 |
| 3,935,332 | 1/1976 | Poliniak et al. ........................ 427/43 |
| 3,964,909 | 6/1976 | Himics et al. ........................ 96/36.2 |

OTHER PUBLICATIONS

Vossen et al., "J. Vac. Sci. Tech.", vol. 12, No. 5, Sep.-/Oct. 1975, pp. 1052–1057.

*Primary Examiner*—John H. Newsome
*Attorney, Agent, or Firm*—H. Christoffersen; Birgit E. Morris

[57] ABSTRACT

This invention relates to a method of transferring a surface relief pattern to a non-metallic inorganic layer wherein a surface relief pattern is formed in a wet poly(1-methyl-1-cyclopropene sulfone) layer and is then sputter etched into the non-metallic inorganic layer from the wet layer.

7 Claims, 5 Drawing Figures

METHOD OF TRANSFERRING A SURFACE RELIEF PATTERN FROM A POLY(1-METHYL-1-CYCLOPROPENE SULFONE) LAYER TO A NON-METALLIC INORGANIC LAYER

CROSS REFERENCES TO RELATED APPLICATIONS

This application is related to copending applications entitled, "METHOD OF TRANSFERRING A SURFACE RELIEF PATTERN FROM A WET POLY (OLEFIN SULFONE) LAYER TO A METAL LAYER", by E..S. Poliniak and N. V. Desai, Ser. No. 710,134 filed July 30, 1976; copending application "METHOD OF TRANSFERRING A SURFACE RELIEF PATTERN FROM A POLY (OLEFIN SULFONE) LAYER TO A METAL LAYER", by E. S. Poliniak, N. V. Desai and R. J. Himics, Ser. No. 710,184 filed July 30, 1976 now U.S. Pat. No. 4,045,318 copending application "METHOD FOR FORMING A SHALLOW SURFACE RELIEF PATTERN IN A POLY (OLEFIN SULFONE) LAYER", by E. S. Poliniak and N. V. Desai, Ser. No. 710,135 filed July 30, 1976 and copending application "METHOD FOR FORMING A SURFACE RELIEF PATTERN IN A POLY (OLEFIN SULFONE) LAYER", by E. S. Poliniak and N. V. Desai, Ser. No. 710,133 filed July 30, 1976 which applications are herein incorporated by reference.

BACKGROUND OF THE INVENTION

Surface relief patterns formed in poly(olefin sulfone) polymers by electron beam resist methods are utilized for a variety of applications. For example, poly (1-methyl-1-cyclopentene sulfone) has been used for audio/video recording applications and is more fully described in U.S. Pat. Nos. 3,935,331 and 3,935,332 by Poliniak et al; poly(keto-olefine sulfones) as described in U.S. Pat. No. 3,964,909 to Himics et al and poly(1-butene sulfone) have been employed for integrated circuit mask formation; and poly(cyclopentene sulfone) and poly(bicycloheptene sulfone) have been used for multilayer integrated circuit mask formation.

The sputter etching of one particular poly(olefin sulfone), poly(styrene sulfone) into $SiO_2$ layers has been described in Journal of the Electro Chemical Society, Vol. 121, pages 1620-23 (1974) by M. J. Bowden et al; Journal of Applied Polymer Science, Vol. 17, pages 3211-24 (1973) by M. J. Bowden et al; Journal of the Electro Chemical Society, Vol. 120, pages 1722-26 (1973) by L. F. Thompson et al; and in U.S. Pat. No. 3,884,696 to Bowden et al. This is a relatively insensitive poly(olefin sulfone), however, and it does not form surface relief patterns with sharp edge definition.

The sputter etching of surface relief patterns formed in the more sensitive, sharp edge forming poly(olefin sulfones) into metal layers has been described in the above mentioned copending applications to Poliniak et al, Ser. No. 710,134 and to Himics et al, Ser. No. 710,184. In addition to sputtering into metal layers it has been desired to sputter etch surface relief patterns formed in the more sensitive poly(olefin sulfones) into non-metallic inorganic layers such as layers of $SiO_2$. Non-metallic inorganic layers, however, have a much lower sputtering yield than metals. As a result longer sputtering times are required to transfer a surface relief pattern which causes degradation of the poly(olefin sulfones) and the transferred surface relief pattern.

SUMMARY OF THE INVENTION

It has been found that a surface relief pattern formed in a more sensitive poly(olefin sulfone) can be transferred to a non-metallic inorganic layer without degrading the surface relief pattern by dissolving poly(1-methyl-1-cyclopropene sulfone) in a solvent and applying the resultant solution to a non-metallic inorganic layer to form a wet polymer layer. The wet layer is then exposed to a modulated beam of electrons, developed to form a surface relief pattern, and bombarded with sufficient ions to substantially remove the wet layer and form the surface relief pattern in the non-metallic inorganic layer.

DETAILED DESCRIPTION OF THE INVENTION

Poly(1-methyl-1-cyclopropene sulfone) is prepared as described in U.S. Pat. No. 3,893,127 by Kaplan et al, herein incorporated by reference, and then dissolved in a suitable solvent such as nitromethane or aniline. The poly(1-methyl-1-cyclopropene sulfone) solution is then formed into a wet layer on a non-metallic inorganic layer by well known techniques such as spinning, brushing and dipping. The wet layer will retain solvent bound in the layer but will not retain free solvent. Hence, the wet layer will be a firm wet layer. Suitable wet layer thicknesses are from about 0.2 to about 1 micron. Suitable non-metallic inorganic layers are oxides of silicon such as silicon dioxide. These non-metallic inorganic layers may be placed on a substrate such as semiconductor substrates of silicon, gallium-arsenide or germanium. Forming surface relief patterns in non-metallic inorganic layers on semiconductor substrates is useful for such applications as preparing integrated circuits.

In order to form a surface relief pattern in the non-metallic inorganic layer, a surface relief pattern is first formed in the wet poly(olefin sulfone) polymer layer by exposing the wet layer to a modulated beam of electrons. The layer is then developed with a developer solvent such as methyl acetonitrile, 2-5 hexanedione, methyl acetoacetate, and acetonyl acetate. Although the exact mechanism of recording is not known, it is believed the electron beam degrades the $SO_2$—C-linkage. This changes the solubility characteristics of the polymer so that, for positive-acting polymers, contact with the solvent dissolves the exposed portions of the film more rapidly than the unexposed portions. Additional details for preparing poly(1-methyl-1-propene sulfone) layers and recording surface relief patterns thereon are described more fully in U.S. Pat. Nos. 3,935,331 and 3,935,332 to Poliniak et al which are herein incorporated by reference.

Figure 1:
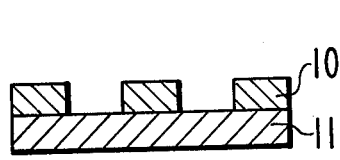
FIG. 1 is a cross-sectional view of a developed poly(1-methyl-1-cyclopropene sulfone) layer on a non-metallic inorganic layer.
Figure 2:
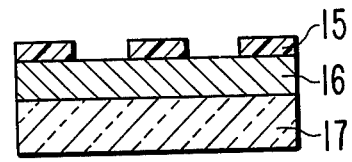
FIG. 2 is a cross-sectional view of a developed poly(1-methyl-1-cyclopropene sulfone) layer, a non-metallic inorganic layer, and a substrate.
Figure 3:
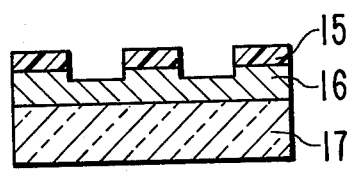
FIG. 3 is a cross-sectional view of a developed poly(1-methyl-1-cyclopropene sulfone) layer, a non-metallic inorganic layer, and a substrate.
Figure 4:
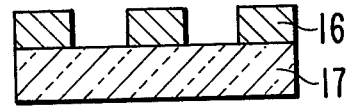
FIG. 4 is a cross-sectional view of a sputter etched non-metallic inorganic layer on a substrate.

FIG. 1 is a cross-section illustration of a surface relief pattern formed in a wet poly(1-methyl-1-cyclopropene sulfone) layer 10 which is adhered to the surface of a non-metallic inorganic layer 11. The surface relief pattern in the wet poly(1-methyl-1-cyclopropene sulfone) layer 10 may be developed either part way or completely through to the surface of the non-metallic inorganic layer 11. In another embodiment of this invention shown in FIG. 2, a surface relief pattern is formed on a wet poly(1-methyl-1-cyclopropene sulfone) layer 15 which is adhered to the surface of a thin non-metallic inorganic layer 16 which is in turn adhered to a substrate 17. After formation of the surface relief pattern on the wet poly(1-methyl-1-cyclopropene sulfone) layer 15, the surface relief pattern is bombarded with ions which causes the removal of materials from the bombarded surface. As shown in FIG. 2, the surface relief pattern on the wet poly(1-methyl-1-cyclopropene sulfone) layer 15 exposes certain portions and covers other portions of the non-metallic inorganic layer 16. During ion bombardment, both the exposed non-metallic inorganic layer 16 and the polymer layer 15 are eroded simultaneously. As shown in FIG. 3, a surface relief pattern forms in the non-metalic layer 16 which corresponds to the surface relief pattern of the polymer layer 15. The bombardment is continued until the substrate 17 is penetrated. After bombardment has been completed, any residual polymer is removed by standard techniques such as reactive sputter cleaning or chemical stripping with organic solvents or strong oxidizing agents such as Caro's acid or chromate sulfuric acid. FIG. 4 shows the surface relief pattern transferred to the non-metallic inorganic layer 16.

Figure 5:
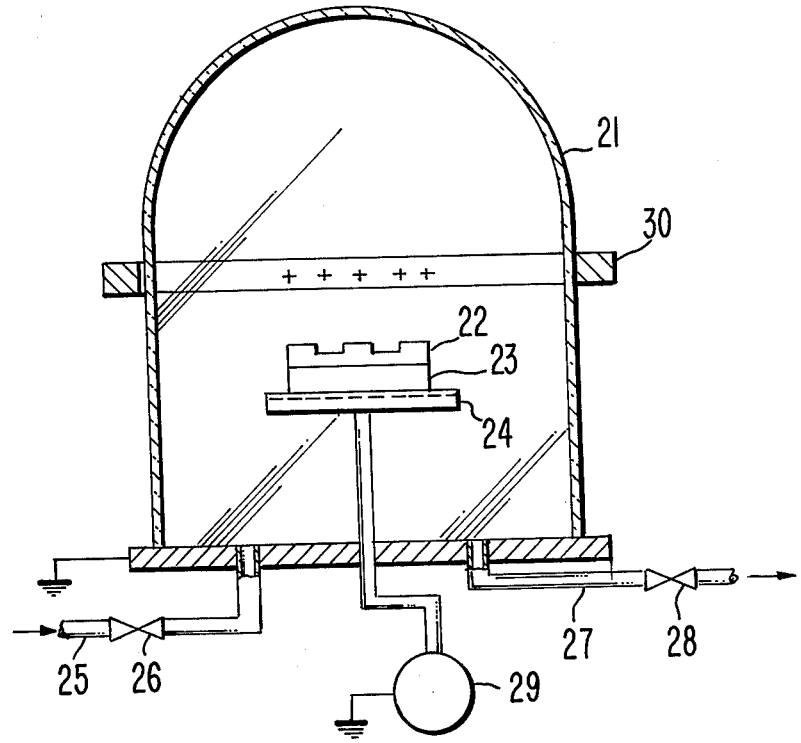
FIG. 5 is a schematic view of an ion bombarding apparatus.

A schematic diagram of an apparatus for sputter etching by ion bombardment is shown in FIG. 5. In a housing 21 is placed a poly(1-methyl-1-cyclopropene sulfone) layer 22 and a non-metallic inorganic layer 23 on a metal plate 24. A continuous flow of low pressure inert gas is maintained in the housing 21 which is introduced through a line 25 and a valve 26 and withdrawn through a line 27 and a valve 28. On the metal plate 24 is created a negative potential by means of a negatively D.C. biased radio frequency generator 29 grounded to the apparatus. The negative potential on plate 24 is maintained at sufficient magnitude to create a glow discharge primarily of positive ions in the inert gas above the plate 24. To steady the glow discharge, a magnetic field above the plate 24 is imposed by means of a magnetic coil 30. The positive ions in the glow discharge are forced by the negative potential of the plate 24 to spiral towards the plate 24 and strike the poly(1-methyl-1-cyclopropene) layer 22 on the non-metallic inorganic layer 23. This causes erosion of the struck surface. The erosion is continued until the poly(1-methyl-1-cyclopropene sulfone) layer 22 is substantially removed and until sufficient penetration of the surface relief pattern into the non-metallic inorganic layer 23 has occurred. The glow discharge is then terminated and the patterned non-metallic inorganic layer 23 is removed from the housing 21.

This invention will be further illustrated by the following Examples, but it is to be understood that the invention is not meant to be limited to the details described therein.

EXAMPLE 1

Poly(1-methyl-1-cyclopropene sulfone) was prepared by adding about 0.1 mole of 1-methyl-1-cyclopropene monomer to about 25 to 30 ml of cold liquified $SO_2$ at about $-75°$ C, adding 0.2ml of t-butylhydroperoxide and reacting for about 6 hours. The poly(1-methyl-1-cyclopropene sulfone) was purified by precipitation from methanol. The purified polymer was then dissolved in aniline solvent to form a 9% by weight solution. Next, the polymer solution was spin coated onto a silicon dioxide layer 9000 angstroms thick which layer was on a silicon semiconductor substrate. The wet polymer layer was about 1 micron thick. The spun samples were covered and allowed to stand for 24 hours at room temperature in order to relieve any strain in the polymer layer.

Utilizing an electron scanning microscope with a 10 kilovolt, 3 nanoampere source, the wet layer was exposed to a modulated Gaussian shaped beam with a diameter of about 0.21 micron. The polymer layer was exposed to the electron beam using a scan speed of 10 cm per second. The layer was then developed by contacting with methyl acetonitrile solvent which formed surface relief patterns in the polymer layer, rinsing with Freon TF and then spin drying.

Next, employing an apparatus as described in FIG. 5, the surface relief pattern was sputter etched into the $SiO_2$ layer under the following conditions:

Pressure of Argon: 2.5 microns
Magnetic Field Coil: 20 gauss
RF Sheath Voltage: 1000 volts
Time of Etching: 20 minutes The residual polymer layer was removed using nitro methane. It was found that the original pattern in the polymer layer had been transferred to the $SiO_2$ layer with penetration into the silicon substrate.

EXAMPLES 2-5

As controls, Examples 2-5 essentially repeated Example 1 except that in Example 2 the polymer layer employed was poly(3-(cyclopentyl-1-cyclopentene sulfone) rather than (1-methyl-1-cyclopropene sulfone); in Example 3 the polymer was poly(1-cyclopentene sulfone); in Example 4 the polymer was poly(3-methyl-1-cyclopentene sulfone); and in Example 5 the polymer was poly(1-methyl-1-cyclopentene sulfone). In Examples 2 through 4 the polymer layers become sintered upon sputter etching which resulted in pitted surfaces. With Example 5 a deep pattern could not be delineated.

We claim:

1. A method for forming a surface relief pattern in a non-metallic inorganic layer which comprises:
   a. dissolving poly(1-methyl-1-cyclopropene sulfone) in a solvent;
   b. applying the resultant solution to the non-metallic inorganic layer to form a wet poly(1-methyl-1-cyclopropene sulfone) layer on the non-metallic inorganic layer;
   c. exposing the wet layer to a modulated beam of electrons;
   d. developing the exposed wet layer to form a surface relief pattern;
   e. bombarding the developed surface with sufficient ions to substantially remove the wet layer and form the surface relief pattern in the non-metallic inorganic layer.

2. A method according to claim 1 wherein the non-metallic inorganic layer is an oxide of silicon.

3. A method according to claim 1 wherein the non-metallic inorganic layer is $SiO_2$.

4. A method according to claim 1 wherein the wet polymer layer is from about 0.3 to about 1.0 micron thick.

5. A method according to claim 1 wherein the non-metallic inorganic layer is on a substrate.

6. A method according to claim 5 wherein the non-metallic inorganic layer is about 9000 angstroms thick.

7. A method according to claim 5 wherein the substrate is silicon.